United States Patent [19]

Baglee et al.

[11] Patent Number: 4,928,267

[45] Date of Patent: May 22, 1990

[54] METHOD OF RECONDITIONING AN ELECTRONICALLY PROGRAMMABLE MEMORY DEVICE

[75] Inventors: David A. Baglee; Ronald N. Parker, both of Houston, Tex.

[73] Assignee: Texas Instruments Incorporated, Dallas, Tex.

[21] Appl. No.: 776,715

[22] Filed: Sep. 16, 1985

[51] Int. Cl.⁵ .............................................. G11C 7/00
[52] U.S. Cl. .................................................... 365/218
[58] Field of Search ................ 365/185, 218; 357/23.5

[56] References Cited

U.S. PATENT DOCUMENTS 3,978,577  9/1976  Bhattacharyya et al. ......... 357/23.5

OTHER PUBLICATIONS

Journal De Physique-Colloque C4; Supplement No. 10, Tome 72, Oct. 1981-pp. C4-1115 to C4-1121.

Primary Examiner—James W. Moffitt
Attorney, Agent, or Firm—Lawrence J. Bassuk; Thomas W. DeMond; Melvin Sharp

[57] ABSTRACT

A method of reconditioning an electrically programmable semiconductor read only memory cell which includes heating the cell to a temperature which is sufficiently high and for a sufficient duration so that the Write/Erase window is re-opened.

6 Claims, 3 Drawing Sheets

METHOD OF RECONDITIONING AN ELECTRONICALLY PROGRAMMABLE MEMORY DEVICE

BACKGROUND OF THE INVENTION

The present invention relates to a method of reconditioning an electronically programmable memory device to re-open its Write/Erase window after it has narrowed significantly from repeated use.

Devices such as electrically erasable programmable silicon semiconductor read only memory units start out with a Write/Erase window of the order of 5 volts with about a 3.5 volt threshold in the programmed or write mode and about a $-1.5$ volts threshold in the erase mode. After many read and write cycles this window begins to be reduced. For example, after about 100 kilocycles this window may be only 2 volts and after several thousand more cycles may disappear altogether. It is thought that this gradual reduction in the window may be due to trapping of charge in the silicon dioxide at the silicon-dioxide interface due to the breaking of oxygen bonds in this region. The broken oxygen bonds serve to trap electrons. A small window makes it difficult to distinguish between a "1" and a "0".

It is therefore a principal object of this invention to provide a method of extending the life of an electrically erasable programmable read only memory device. In particular, it is an object to provide a method of reconditioning such a device after its Write/Erase window has been reduced significantly so as to re-open its window.

SUMMARY OF THE INVENTION

According to the invention there is provided a method of reconditioning an electrically programmable semiconductor read only memory cell which includes heating the cell to a temperature which is sufficiently high and for a sufficient duration so that the Write/Erase window is re-opened.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
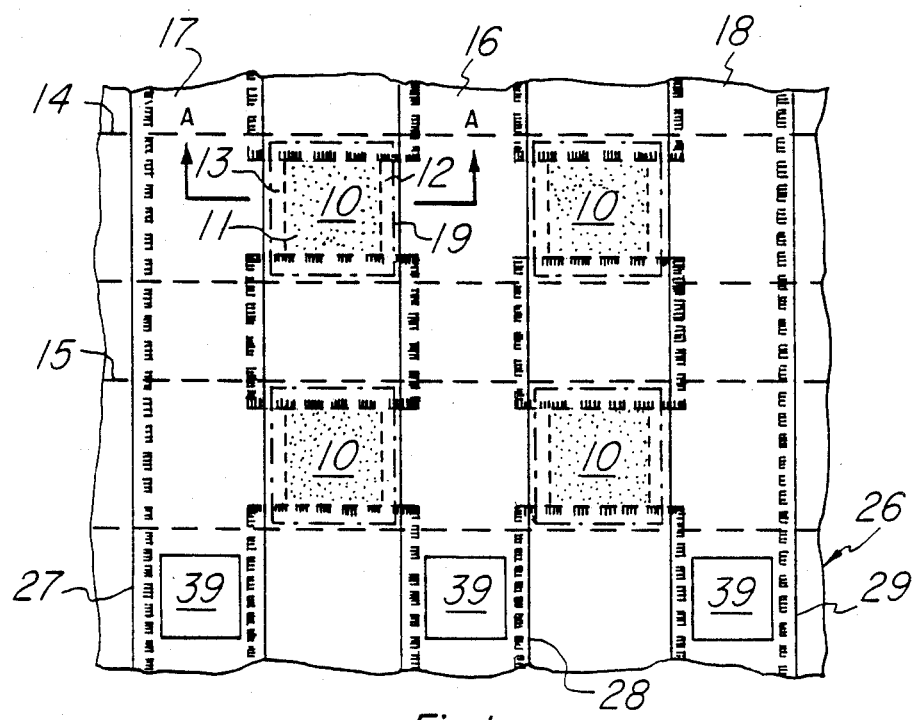
FIG. 1 is a greatly enlarged plan view of a small portion of a semiconductor chip showing the physical layout of a part of an EPROM array made according to the invention.
Figure 2:
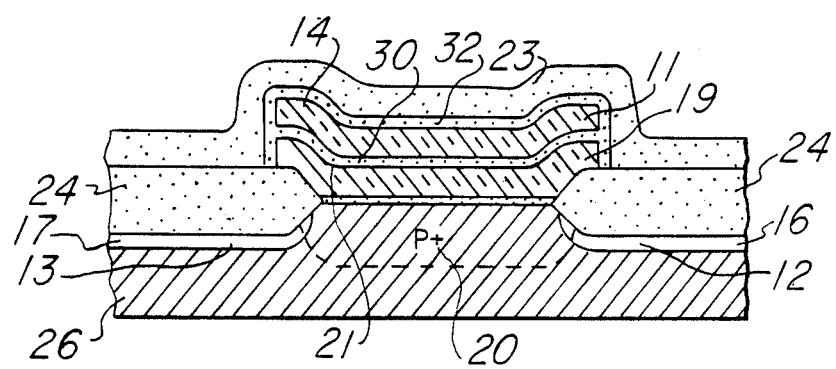
FIG. 2 is elevation a view in section of one of the cells of FIG. 1 taken along line a-a.

With reference to FIGS. 1 and 2 an electrically programmable read only memory device EPROM is illustrated as an example of a type of memory device to which the present invention is applicable. The construction, method of fabrication and operation of this device is set forth in U.S. Pat. No. 4,258,466 issued Mar. 31, 1981 to Kuo et al and assigned to Texas Instruments. Other similar devices are described in U.S. Pat. No. 4,122,544 issued to David J. McElroy and U.S. Pat. No. 4,122,509 issued to Lawrence S. Wall, both assigned to Texas Instruments.

The device consists of a large number of cells 10 only 4 of which are shown in FIG. 1. Each cell is an MOS transistor having a floating gate 19 and control gate 11 of polysilicon and a source 12 and a drain 13. The sources 12 are part of $N^+$ diffused regions 17 and 18 which are Y output lines. A $P^+$ channel 20 is provided for optimum programming characteristics. Layers of gate oxide 21 and interlevel oxide 30 of the order of 350–400 Angstroms thick separate the floating gate 19 and channel 20 and control gate 32 and floating gate 19, respectively. A thick layer 23 of deposited oxide covers the upper layer of polysilicon and field oxide coatings 24.

The array, formed on a silicon bar 26, would typically contain perhaps 64 or 128K bits on a bar less than about 200 mils on a side or 40,000 square mil area depending upon the bit density. The four cells shown would be on a minute part of the bar perhaps 1 mil wide. A 64K EPROM would require 256 of the X address lines such as 14 and 15 and 256 of the Y lines like 17 and 18. Metal strips 27, 28 and 29 overlie regions 16, 17 and 18 and make contact with the latter regions periodically. Contact regions 39 are areas in which metal layers 27, 28 and 29 contact the underlying silicon.

The cell array is programmed by injection of electrons into the floating gates 19 by application of a high voltage to a selected one of the polysilicon strips 14 or 15 coupling associated rows of control gates 11 and one of the Y lines 17 or 18 to raise the threshold voltage of the selected one of the cells 10 to a value above that which will be turned on by a logic level voltage on an address line 14, 15 etc. For example, Vpp is applied to drain 13 and control gate 11 while source 12 is held at ground or Vss. A large current flows in the channel 20 causing electrons of high energy state to traverse the gate oxide layer to the floating gate 19 until the voltage on the floating gate is sufficiently negative to stop further charging. After the programming voltages are removed the floating gate remained negatively charged. Erasure may either be by ultra violet light or electrically as set forth in U.S. Pat. No. 4,122,544 issued to McElroy mentioned above. Electrical deprogramming or erasure is accomplished by holding the control gate voltage at Vpp and both the source and drain at ground, charge from the floating gate will leak across to the control gate and discharge the latter. With a negatively charged floating a greater positive voltage on the control gate is required to turn it than is the of the former were discharged or positively charged. These threshold voltages are referred to as $V_t$ in the art.

The Write/Erase window of each cell of an electrically programmable read only memory device is the difference between its threshold voltage when the cell has been programmed and that when it has been erased. During programming or writing the floating gate is charged positively so that typically about 3.5 volts is required to turn the device on. During the erase mode the floating gate is charged negatively so that about −1.5 volts typically is required to turn the device on. Thus, for the example given the device has a Write/Erase window of 5.0 volts. However, it has been observed that following an extended number of Write/Erase cycles this window begins to decrease both because the programmed threshold voltage falls and the Erase threshold voltage rises (initially gets smaller negatively). The actual value of these initial threshold voltages may vary from cell to cell in a given device and from type to type of different devices but generally each displays a window reduction with increased number of Write/Erase cycles. After a large number of Write/Erase cycles it often becomes difficult to distinguish between a "0" and a "1".

The window reduction mentioned above is thought to be as a result of the breaking of various molecular bonds between silicon and oxygen or oxygen hydrogen in the silicon dioxide at the silicon dioxide-silicon interface. These broken bonds act as electron traps during the Write or Erase mode.

Figure 3:
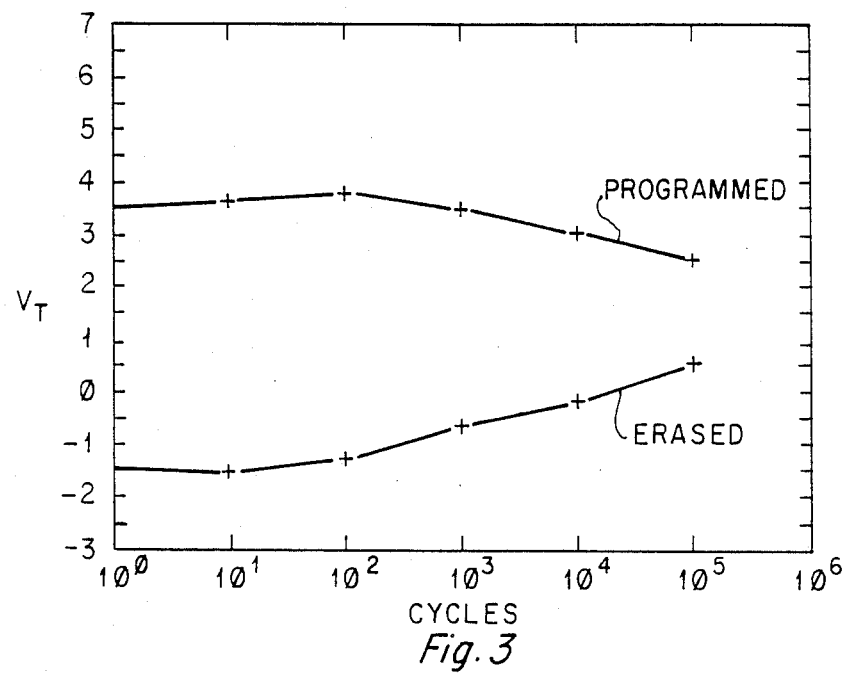
FIG. 3 is a graph showing the Write/Erase window of an EEPROM device as a function of the number of Write/Erase cycles up to a total of 100,000 cycles in all.

By heating the device up to an elevated temperature of at least 150° C. it has been discovered that the Write/Erase window increases where there has been a reduction due to a large number of such cycles. FIG. 3 shows the effect on a Write/Erase window for a EEPROM device as a function of an increasing number of Write/Erase cycles. It will be noted that after 100,000 cycles the window has decreased from an initial 5.1 volts down to about 2.0 volts.

Figure 4:
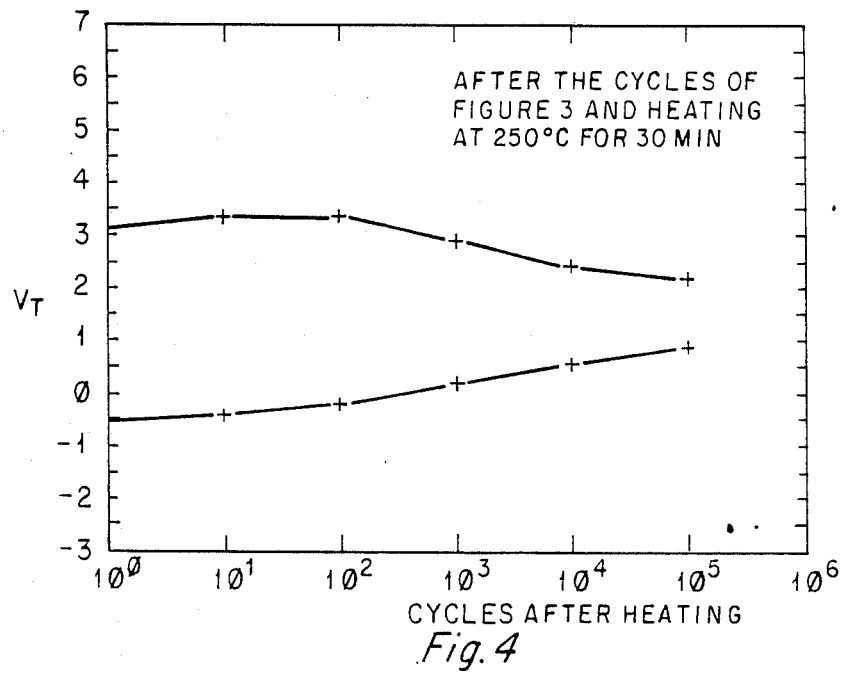
FIG. 4 is a graph showing the Write/Erase window for the EEPROM device subjected to 100,000 cycles as shown in FIG. 3, and; after a 30 minute heat treatment at 250° C., as a function of the number of Write/Erase cycles after such heat treatment.

Upon heating the same device after 100,000 cycles to 250° C. for a ½ hour period and measuring the Write/Erase characteristics of the reconditioned device it was observed that the window had re-opened to about 3.7 volts. Further cycling gave the results as shown in FIG. 4.

Figure 5:
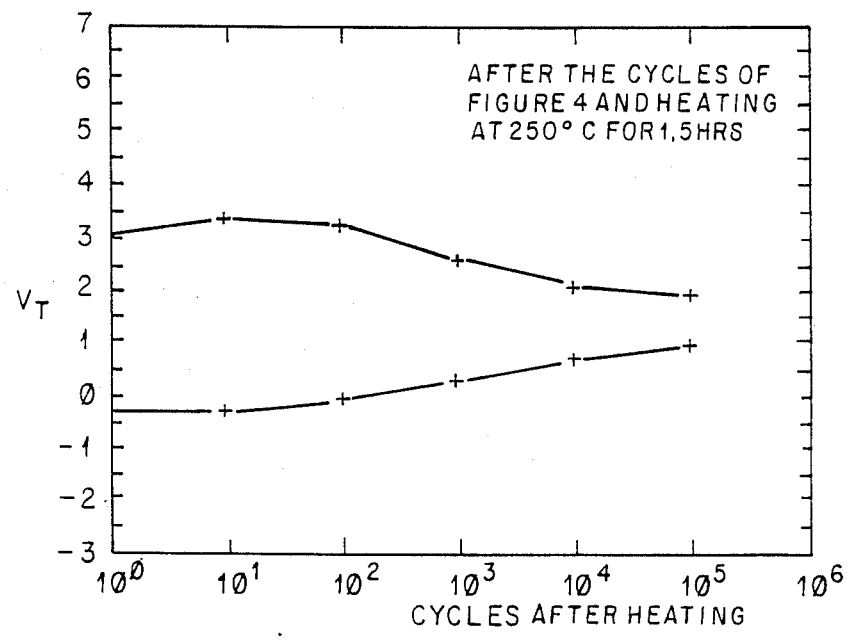
FIG. 5 is a graph showing the Write/Erase window for the EEPROM device subjected to 100,000 cycles as shown in FIG. 3, subjected to the heat treatment and subsequent 100,000 cycles as shown in FIG. 4, and after a further heat treatment for 1.5 hours at 250° C., as a function of the number of Write/Erase cycles after such further heat treatment.

To determine whether a given device can be reconditioned a second time after a first reconditioning following 200,000 cycles the device was once again treated at 250° C. but for a period of 1½ hours. FIG. 5 shows the results of window width as a function of the number of cycles. It will be noted that the initial window width was 3.8 volts and that after a further 100,000 cycles this was reduced to 1.0 volts. Although the method has been illustrated as applied to an N-channel EPROM it is applicable to any device in which charge traps form with repeated cycling in the gate oxide and thereby reduce the $V_t$ window.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed:

1. A method of reconditioning an electrically programmable semiconductor read only memory cell after it has been subjected to a plurality of write and erase cycles resulting in narrowing of its Write/Erase window, comprising:
   heating the cell to a temperature sufficiently high and for a sufficient length of time to re-open said Write/Erase window.

2. A method of according to claim 1, wherein the cell includes an N-channel floating gate transistor.

3. A method according to claim 2, wherein the temperature level is at least about 150° C.

4. A method according to claim 2, wherein the temperature level is in the range of 150° to 275° C.

5. A method according to claim 4, wherein the temperature level is about 250° C.

6. A method according to claim 2, wherein the length of time is in the range of 2 minutes to 10 hours.

* * * * *